(12) United States Patent
Chen et al.

(10) Patent No.: US 12,513,809 B2
(45) Date of Patent: Dec. 30, 2025

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Kuan-Hung Chen, Taoyuan (TW); Shang-Chieh Chien, New Taipei (TW); Li-Jui Chen, Hsinchu (TW); Heng-Hsin Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 930 days.

(21) Appl. No.: 17/659,436

(22) Filed: Apr. 15, 2022

(65) Prior Publication Data
US 2023/0049820 A1 Feb. 16, 2023

Related U.S. Application Data

(60) Provisional application No. 63/260,252, filed on Aug. 13, 2021.

(51) Int. Cl.
*H05G 2/00* (2006.01)
*G03F 7/00* (2006.01)

(52) U.S. Cl.
CPC ....... *H05G 2/0084* (2024.08); *G03F 7/70025* (2013.01); *G03F 7/70033* (2013.01); *G03F 7/70041* (2013.01); *G03F 7/7055* (2013.01); *G03F 7/7085* (2013.01); *H05G 2/0088* (2024.08)

(58) Field of Classification Search
CPC .. H05G 2/0084; H05G 2/0027; H05G 2/0088; H05G 2/005; H05G 2/008; H05G 2/00; H05G 2/001; H05G 2/002; H05G 2/0023; H05G 2/0025; H05G 2/003; H05G 2/0035; H05G 2/006; H05G 2/007; H05G 2/0082; H05G 2/0086; H05G 2/009; H05G 2/0094; G03F 7/70025; G03F 7/70033; G03F 7/70041; G03F 7/7055; G03F 7/7085; G03F 7/70141; G03F 7/7015; G03F 7/70183; G03F 7/70175; G03F 7/70133; G03F 7/70191; G03F 7/70483; G03F 7/70491; G03F 7/705; G03F 7/70508; G03F 7/70516; G03F 7/70525; G03F 7/70533; G03F 7/70541; G03F 7/70558;
(Continued)

(56) References Cited

U.S. PATENT DOCUMENTS

2014/0264091 A1* 9/2014 Fleurov .................. H05G 2/008 250/504 R
2019/0166680 A1* 5/2019 Hsu ........................ H05G 2/008
(Continued)

*Primary Examiner* — Christina A Riddle
(74) *Attorney, Agent, or Firm* — Harrity & Harrity, LLP

(57) ABSTRACT

Some implementations described herein provide a dual-feedback control system for laser beam targeting in a lithography system such as an EUV lithography system. In addition to using feedback from a high-frequency quad-cell sensor to adjust a target position of the pre-pulse laser beam based on a first portion of a phase of a wavefront of the pre-pulse laser beam, the dual-feedback control system uses feedback from a low-frequency camera sensor to adjust the target position of the pre-pulse laser beam based on a second portion of the phase of the wavefront.

20 Claims, 13 Drawing Sheets

(58) Field of Classification Search
CPC .............. G03F 7/70583; G03F 7/70575; G03F 7/70591; G03F 7/70975; G03F 7/70991
USPC .......... 355/18, 30, 52–55, 67–77; 250/492.1, 250/492.2, 492.22, 492.23, 493.1, 494.1, 250/495.1, 503.1, 504 R, 505.1
See application file for complete search history.

(56) References Cited

U.S. PATENT DOCUMENTS

| | | | |
|---|---|---|---|
| 2020/0057382 A1* | 2/2020 | Hsieh .................... | H05G 2/0084 |
| 2020/0075190 A1* | 3/2020 | Cheng ................... | H05G 2/0035 |
| 2021/0318625 A1* | 10/2021 | Yang ...................... | H05G 2/009 |
| 2023/0269858 A1* | 8/2023 | Haghi ................. | G03F 7/70033 |
| | | | 250/504 R |

* cited by examiner

SEMICONDUCTOR PROCESSING TOOL AND METHODS OF OPERATION

CROSS-REFERENCE TO RELATED APPLICATION

This patent application claims priority to U.S. Provisional Patent Application No. 63/260,252 filed on Aug. 13, 2021, and entitled "Semiconductor Processing Tool and Methods of Operation." The disclosure of the prior application is considered part of and is incorporated by reference into this patent application.

BACKGROUND

An extreme ultraviolet (EUV) radiation source includes a collector, which includes a curved mirror that is configured to collect EUV radiation and to focus the EUV radiation toward an intermediate focus near an intermediate focus cap (IF cap) of the EUV radiation source. The EUV radiation is produced from a laser produced plasma (LPP) that is generated by exposing droplets of tin (Sn) to a carbon dioxide ($CO_2$)-based laser. The Sn droplets are generated by a droplet generator (DG) head, which provides the Sn droplets into a scanner chamber to an irradiation site where the Sn droplets are irradiated by a focused laser beam.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
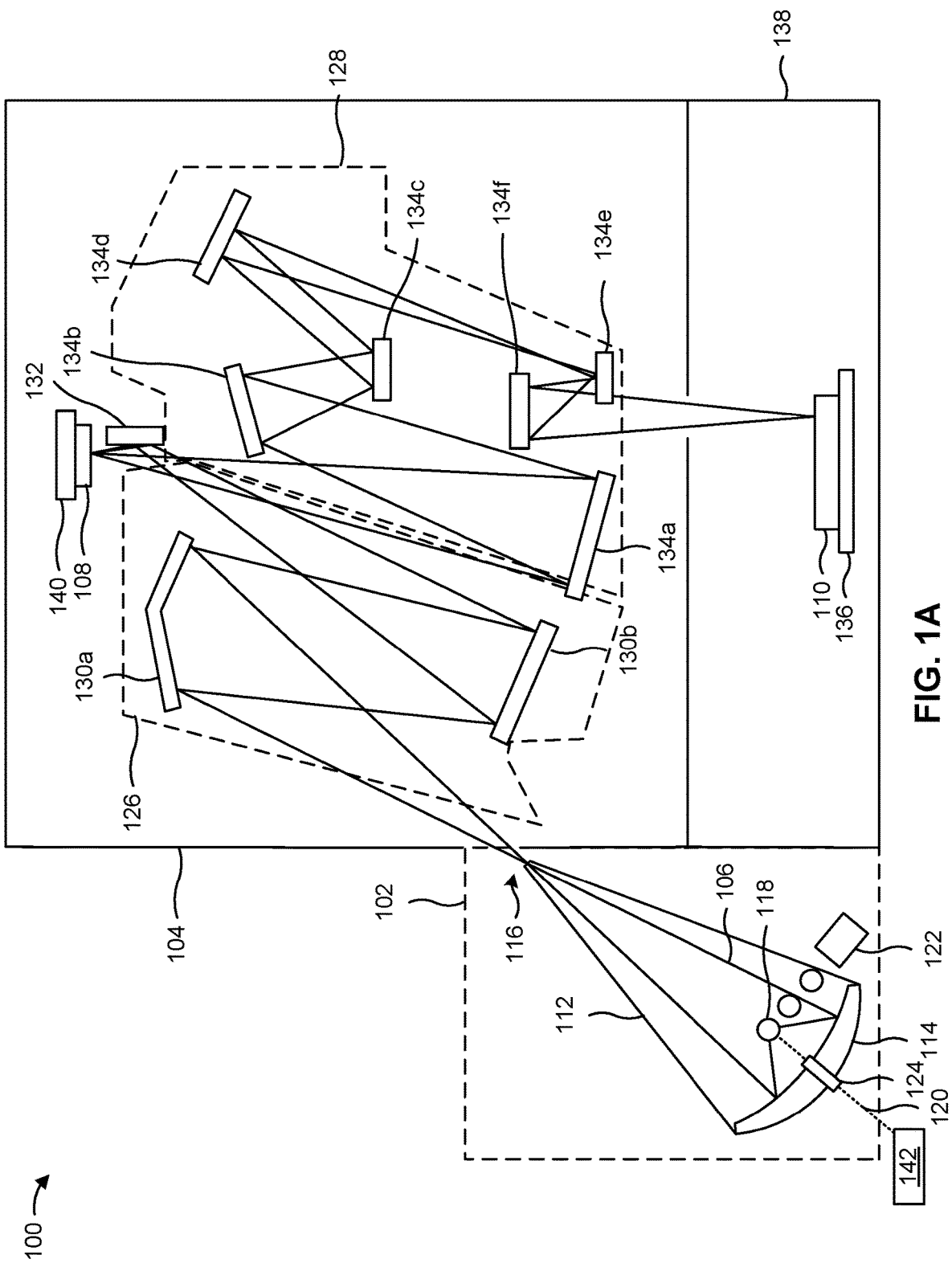
FIGS. 1A and 1B are diagrams of an example lithography described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A laser source for an extreme ultraviolet (EUV) radiation source may generate laser beams using a multi-pulse technique (or a multi-stage pumping technique), in which the laser source generates a pre-pulse laser beam and main-pulse laser beam to achieve greater heating efficiency in tin-based plasma to increase conversion efficiency. A carbon dioxide ($CO_2$)-based laser source is an example laser source that can provide high power and energy. Moreover, due to the wavelength of the laser beams generated by a $CO_2$-based laser source in an infrared (IR) region, the laser beams may have a high absorption rate in tin, which enables the $CO_2$-based laser source to achieve high power and energy for pumping tin-based plasma.

A laser produced plasma (LPP) may be generated from target material (e.g., tin or another type of target material) droplets, which are shot into a vessel of the EUV radiation source from a droplet generator. The laser source generates and provides a pre-pulse laser beam toward a target material droplet, and the pre-pulse laser beam is absorbed by the target material droplet. This transforms the target material droplet into disc shape or a mist. Subsequently, the laser source provides a main-pulse laser beam with large intensity and energy toward the disc-shaped target material or the target material mist. Here, the atoms of the target material are neutralized, and ions are generated through thermal flux and shock wave. The main-pulse laser beam pumps ions to a higher charge state, which causes the ions to radiate EUV radiation (e.g., EUV light). The EUV radiation is collected at the collector surface and is directed into a chamber of an exposure tool to expose a semiconductor substrate.

In some cases, a target position (e.g., an aim point or a pointing location, among other examples) of a pre-pulse laser beam may be configured to deform a droplet of a target material at a particular location in a path of travel of the droplet in a vessel of an EUV radiation source. The pre-pulse laser beam may transfer a first amount of energy to the droplet of the target material to form a disc-shaped droplet of the target material. Subsequently, a main-pulse laser beam may transfer a second amount of energy to the disc-shaped droplet of the target material at another location in the path of travel to generate a plasma (e.g., a plasma emitting EUV light).

One or more attributes of the disc-shaped droplet (e.g., a shape, a size, an angle, a path, and/or an orientation) of the target material may affect plasma generation during exposure of the disc-shaped droplet to the main-pulse laser beam. For example, an angle or size of the disc-shaped droplet of the target material may result in a portion of the disc-shaped droplet of the target material being unexposed to the main-pulse laser beam (e.g., the main-pulse laser beam "misses" an edge portion of the disc-shaped droplet of the target material). This may result in the portion of the disc-shaped droplet remaining unconverted to plasma, which may reduce the amount of EUV radiation emitted from an EUV radiation source, may increase the inconsistency (which reduces the repeatability) of EUV radiation generation, and/or may result in incomplete exposure of a photoresist on a semiconductor substrate.

One or more factors may impact synchronization of the pre-pulse laser beam and the disc-shaped droplet of the target material. For example, an accuracy of the target position (e.g., an angle, an orientation, and/or a timing of a pre-pulse laser source that provides the pre-pulse laser beam) may impact synchronization of the pre-pulse laser beam and the disc-shaped droplet of the target material, resulting in mutual position errors (e.g., errors in co-location of the pre-pulse laser beam and the disc-shaped droplet of the target material). Additional factors such as movement of a target position over a period of time (e.g., "drifting" of the target position due to thermal conditions experienced by a source of the pre-pulse laser beam) may exacerbate the mutual position errors. A reduction and/or inconsistency in the amount of EUV radiation due to the mutual position errors cause complications while manufacturing semiconductor devices using the EUV radiation source. For example, mutual position errors may reduce a likelihood of maintaining a targeted EUV radiation dose, a targeted yield rate or quality of a semiconductor device manufactured using the EUV radiation source, and/or an efficient use of the target material, among other examples.

Some implementations described herein provide a dual-feedback control system for laser beam targeting in a lithography system such as an EUV lithography system. The dual-feedback control system is configured to control and adjust a target position of a pre-pulse laser beam using a plurality of feedback control loops. In particular, the dual-feedback control system is configured to use feedback from a high-frequency quad-cell sensor to adjust a target position of the pre-pulse laser beam based on a first portion of a phase of the pre-pulse laser beam, and to use feedback from a low-frequency camera sensor to adjust the target position of the pre-pulse laser beam based on a second portion of the phase of the pre-pulse laser beam.

The dual-feedback control system is configured to detect and determine, based on sensor data provided by the camera sensor, a movement of the target position over a period of time that may otherwise be undetected through the use of the quad-cell sensor alone. In this way, the EUV radiation source maintains an accurate target position of the pre-pulse laser beam to maintain a designated EUV radiation dose, a targeted yield rate or quality of semiconductor devices manufactured using the EUV radiation source, and/or an efficient use of the target material, among other examples.

Figure 1B:
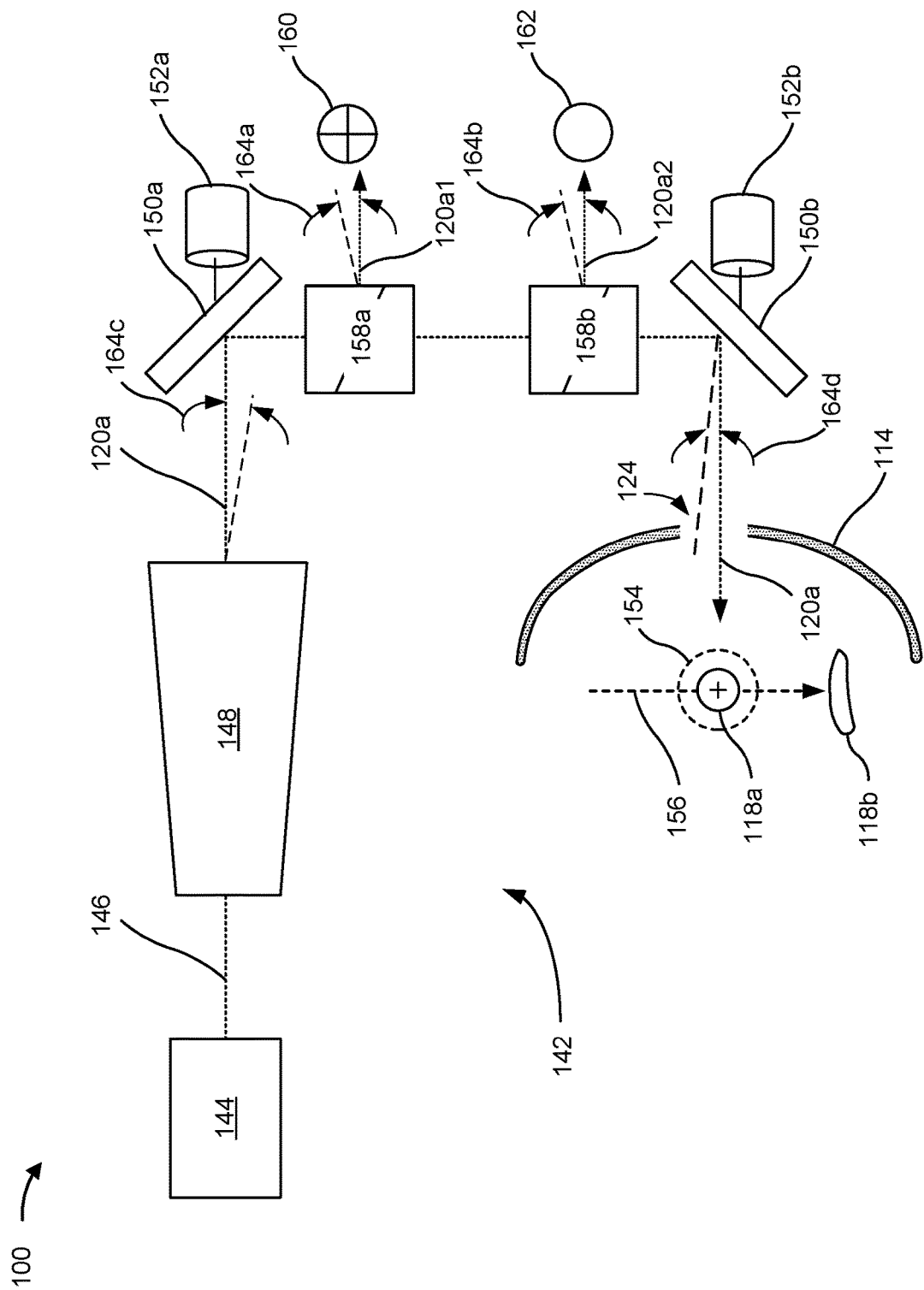

FIGS. 1A and 1B are diagrams of an example lithography system 100 described herein. The lithography system 100 includes an EUV lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1A, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner tool, and EUV exposure tool, or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 of a target material (e.g., droplets of a target material including Sn droplets or another type of droplets) of a target material being exposed to a laser beam 120. The droplets 118 are provided across the front of the collector 114 by a droplet generator (DG) 122. The droplet generator 122 is pressurized to provide a fine and controlled output of the droplets 118. The laser beam 120 is provided such that the laser beam 120 is focused through a window 124 of the collector 114. The laser beam 120 is focused onto the droplets 118 which generates the plasma. The plasma produces a plasma emission, some of which is the radiation 106.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors include, for example, a mirror 130a and a mirror 130b. The mirror 130a includes a field facet mirror (FFM) or another type of mirror that includes a plurality of field facets. The mirror 130b includes a pupil facet mirror (PFM) or another type of mirror that also includes a plurality of pupil facets. The facets of the mirrors 130a and 130b are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors include, for example, mirrors 134a-134f. In some implementations, the mirrors 134a-134f are configured to focus or reduce the radiation 106 into an exposure field, which may include one or more die areas on the semiconductor substrate 110.

The exposure tool 104 includes a wafer stage 136 (or a substrate stage) configured to support the semiconductor substrate 110. Moreover, the wafer stage 136 is configured to move (or step) the semiconductor substrate 110 through a plurality of exposure fields as the radiation 106 transfers the pattern from the reticle 108 onto the semiconductor substrate 110. The wafer stage 136 is included in a bottom module 138 of the exposure tool 104. The bottom module 138 includes a removable subsystem of the exposure tool 104. The bottom module 138 may slide out of the exposure tool 104 and/or otherwise may be removed from the exposure tool 104 to enable cleaning and inspection of the wafer stage 136 and/or the components of the wafer stage 136. The bottom module 138 isolates the wafer stage 136 from other areas in the exposure tool 104 to reduce and/or minimize contamination of the semiconductor substrate 110. Moreover, the bottom module 138 may provide physical isolation for the wafer stage 136 by reducing the transfer of vibrations (e.g., vibrations in the semiconductor processing environment in which the lithography system 100 is located, vibrations in the lithography system 100 during operation of the lithography system 100) to the wafer stage 136 and, therefore, the semiconductor substrate 110. This reduces movement and/or disturbance of the semiconductor substrate 110, which reduces the likelihood that the vibrations may cause a pattern misalignment.

The exposure tool 104 also includes a reticle stage 140 that is configured to support and/or secure the reticle 108. Moreover, the reticle stage 140 is configured to move or slide the reticle 108 through the radiation 106 such that the reticle 108 is scanned by the radiation 106. In this way, a pattern that is larger than the field or beam of the radiation 106 may be transferred to the semiconductor substrate 110.

The lithography system 100 includes a laser source 142. The laser source 142 is configured to generate one or more laser beams 120. The laser source 142 may include a $CO_2$-based laser source or another type of laser source. Due to the wavelength of the laser beams generated by a $CO_2$-based laser source in an IR region, the laser beams may be highly absorbed by tin, which enables the $CO_2$-based laser source to achieve high power and energy for pumping tin-based plasma. In some implementations, the one or more laser beams 120 include a pre-pulse laser beam that includes a plurality of types of laser beams that the laser source 142 generates using a multi-pulse technique (or a multi-stage pumping technique), in which the laser source 142 generates a pre-pulse laser beam and a main-pulse laser beam to achieve greater heating efficiency of tin (Sn)-based plasma to increase conversion efficiency.

As described in greater detail herein, the laser source 142 may perform a combination of operations to deform the droplet 118 (e.g., deform the droplet 118 into a disc shape or a mist using the pre-pulse laser beam) and pump ions of the droplet 118 to a higher charge state (e.g., pump ions of the droplet 118, after deformation, using the main-pulse laser beam), which causes the ions to radiate the radiation 106 (e.g., EUV light).

The radiation 106 is collected by the collector 114 and directed out of the vessel 112 and into the exposure tool 104 toward the mirror 130a of the illuminator 126. The mirror 130a reflects the radiation 106 onto the mirror 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 106 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

FIG. 1B is a diagram of an example laser source 142 described herein for use in the lithography system 100 of FIG. 1A. The laser source 142 is configured to generate and provide a pre-pulse laser beam 120a to a radiation source (e.g., the radiation source 102) through the window 124 of the collector 114 for EUV radiation generation. The pre-pulse laser beam 120a may generate a disc-shaped droplet of the target material 118b (e.g., apply energy to a droplet of the target material 118a to deform the droplet of the target material 118a) within a vessel of the radiation source (e.g., the vessel 112).

As shown in FIG. 1B, the laser source 142 includes a pre-pulse seed laser 144 (e.g., a drive laser). The pre-pulse seed laser 144 includes a semiconductor laser driver (e.g., a quantum dot laser driver, a diode laser driver), a resonator (or resonation chamber), an oscillator, a laser mode actuator or controller, and/or another component that is configured to generate a seed pre-pulse laser beam 146. The seed pre-pulse laser beam 146 is provided to a pre-pulse amplifier chain 148, which may include one or more laser amplifiers. The one or more laser amplifiers may include a preamplifier, a main amplifier, and/or another type of amplifier that is configured to amplify the seed pre-pulse laser beam 146 to form the pre-pulse laser beam 120a.

In some implementations, the laser source 142 includes one or more other components, such as an optical component (e.g., a filter) configured to select a particular wavelength for the seed pre-pulse laser beam 146 and/or adjust or modify other parameters of the seed pre-pulse laser beam 146. The pre-pulse laser beam 120a may be provided to the radiation source 102 by mirrors 150, including mirror 150a and mirror 150b, among other examples. The mirrors 150 may include a concave or a convex shape, may include a multi-layer mirror, or may include one or more facets, among other examples. In some implementations, the laser source 142 includes a greater or a lesser quantity of the mirrors 150.

The laser source 142 may include motors 152 (e.g., motor 152a and motor 152b, among other examples) to adjust respective orientations (e.g., respective angular positions, respective linear positions, among other examples) of the mirrors 150. Examples of the motors 152 include a stepper motor, a servo motor, or a linear induction motor, among other examples. Furthermore, the motors 152 may be mechanically coupled to the mirrors 150 using one or more of a gimble component, a linear bearing component, a rotational bearing component, or a ball-screw component, among other examples. In some implementations, the laser source 142 includes a greater or a lesser quantity of the motors 152.

In combination, the mirrors 150 and the motors 152 are arranged to focus and/or otherwise direct the pre-pulse laser beam 120a to a target position 154. The location of the target position 154 in the vessel 112 may be included in a path 156 along which the droplet of the target material 118a travels in the vessel 112. The location of the target position 154 of the pre-pulse laser beam 120a may be different from a location of a target position of a main-pulse laser beam provided by the laser source 142.

In some implementations, the target position 154 corresponds to a pre-pulse laser focus region at which the pre-pulse laser beam 120a irradiates the droplet of the target material 118a along the path 156 to deform the droplet of the target material 118a. The laser source 142 may be configured such that, at the target position 154, the pre-pulse laser beam 120a irradiates the droplet of the target material 118a with a beam diameter of approximately 80 micrometers (µm) to approximately 120 µm. However, other values for the beam diameter are within the scope of the present disclosure. A designated accuracy of the target position 154 may be in a range from approximately −10 µm to approximately +10 µm so that a partial deformation of the droplet of the target material 118a does not reduce an amount of EUV energy during a subsequent pulsing of the disc-shaped droplet of the target material 118b by a main-pulse laser beam. However, other values for the designated accuracy are within the scope of the present disclosure.

As an example, and if the accuracy of the target position 154 ranges from approximately −20 µm to approximately +20 µm, the EUV energy during the subsequent pulsing of the disc-shaped droplet of the target material 118b by the main-pulse laser beam may drop by a range from approximately 3 millijoules (mJ) to approximately 5 mJ. However, other values for the drop in EUV energy are within the scope of the present disclosure.

The laser source 142 may include a quad-cell sensor optical component 158a. The quad-cell sensor optical component 158a includes a beam splitter, a multiple-layer mirror, a multiple-layer reflector, and/or another type of optical component. The quad-cell sensor optical component 158a redirects a portion 120a1 of the pre-pulse laser beam 120a and provides the portion 120a1 to a quad-cell sensor 160. The quad-cell sensor 160 may include, for example, arrays of photodiodes that convert light into an electrical current. The quad-cell sensor 160 is configured to generate sensor data based on one or more properties of a wavefront (e.g., an intensity, a frequency, a phase angle, among other examples) associated with portion 120a1 across each cell of the quad-cell sensor 160 (e.g., four cells). The quad-cell sensor 160 may provide, to a controller of the laser source 142, the sensor data corresponding to the one or more properties. The controller may determine, based on the sensor data, a structure of the wavefront, a phase of the wavefront, an angle of incidence 164a (e.g., a three-dimensional angle of incidence), and/or another attribute of the wavefront. In some implementations, the controller uses Zernike polynomial techniques to determine one or more attributes of the wavefront based on the sensor data.

The laser source 142 may include a camera sensor optical component 158b. The camera sensor optical component 158b includes a beam splitter, a multiple-layer mirror, a multiple-layer reflector, and/or another type of optical component. The camera sensor optical component 158b redirects a portion 120a2 of the pre-pulse laser beam 120a and provides the portion 120a2 to a camera sensor 162. The camera sensor 162 may include a complimentary metal-oxide semiconductor sensor or a charge-coupled device sensor, among other examples. The camera sensor 162 is configured to generate sensor data based on one or more properties of a wavefront (e.g., an intensity, a frequency, a phase, among other examples) associated with the portion 120a2 across a field of view of the camera sensor 162 and provide, to the controller, data corresponding to the one or more properties. The controller may determine, based on the sensor data, a structure of the wavefront, a phase of the wavefront, an angle of incidence 164b (e.g., a three-dimensional angle of incidence), and/or another attribute of the wavefront. In some implementations, the controller uses Zernike polynomial techniques to determine one or more attributes of the wavefront based on the sensor data.

One or more variations in the angle of incidence 164a and/or the angle of incidence 164b may be proportional to a variation in an angle of incidence 164c (e.g., a three-dimensional angle of incidence) and/or proportional to a variation in an angle of incidence 164d (e.g., a three-dimensional angle of incidence) of the pre-pulse laser beam 120a. This may occur because the pre-pulse laser beam 120a is redirected by the mirrors 150 to the target position 154. The laser source 142 (e.g., the controller of the laser source 142) may determine, based on a detected variation in the angle of incidence 164a and/or a detected variation in the angle of incidence 164b, that the target position 154 has drifted and is not properly aligned to the focus region (e.g., aligned to an intercept point, or mutual location, for intercepting the droplet of the target material 118a.) The controller may provide, based on determining that the target position 154 has drifted, one or more signals to the motors 152 to adjust an orientation of one or more of the mirrors 150 to properly align the target position 154 to the focus region.

In some implementations, adjustments to the target position 154 (e.g., adjustments to one or more orientations of the mirrors 150 by the motors 152) are made to synchronize a location of the pre-pulse laser beam 120a and a location of the droplet of the target material 118a traversing the path 156 within the vessel of the EUV radiation source.

In some implementations, the quad-cell sensor optical component 158a and the camera sensor optical component 158b are co-located. In some implementations, the quad-cell sensor 160 and the camera sensor 162 are co-located. In some implementations, the quad-cell sensor 160 and the camera sensor 162 are included in the same device. In some implementations, the quad-cell sensor 160 and the camera sensor 162 are included in the same system on chip (SoC) and/or on the same semiconductor die. In some implementations, the quad-cell sensor 160 and the camera sensor 162 are included in the same integrated circuit.

Although FIG. 1B describes aspects of the laser source 142 generating the pre-pulse laser beam 120a and adjusting the target position 154 to align with the pre-pulse focus region, aspects of FIG. 1B are also applicable to generating a main-pulse laser beam and adjusting a targeting position of the main-pulse laser beam to align to a main-pulse laser focus region (e.g., a region at which the main-pulse laser beam generates a plasma from the disc-shaped droplet of the target material 118b).

As indicated above, FIGS. 1A and 1B are provided as examples. Other examples may differ from what is described with regard to FIGS. 1A and 1B. For example, another example may include additional components, fewer components, different components, or differently arranged components than those shown in FIGS. 1A and 1B. Additionally, or alternatively, a set of components (e.g., one or more components) of FIGS. 1A and 1B may perform one or more functions described herein as being performed by another set of components.

Figure 2:
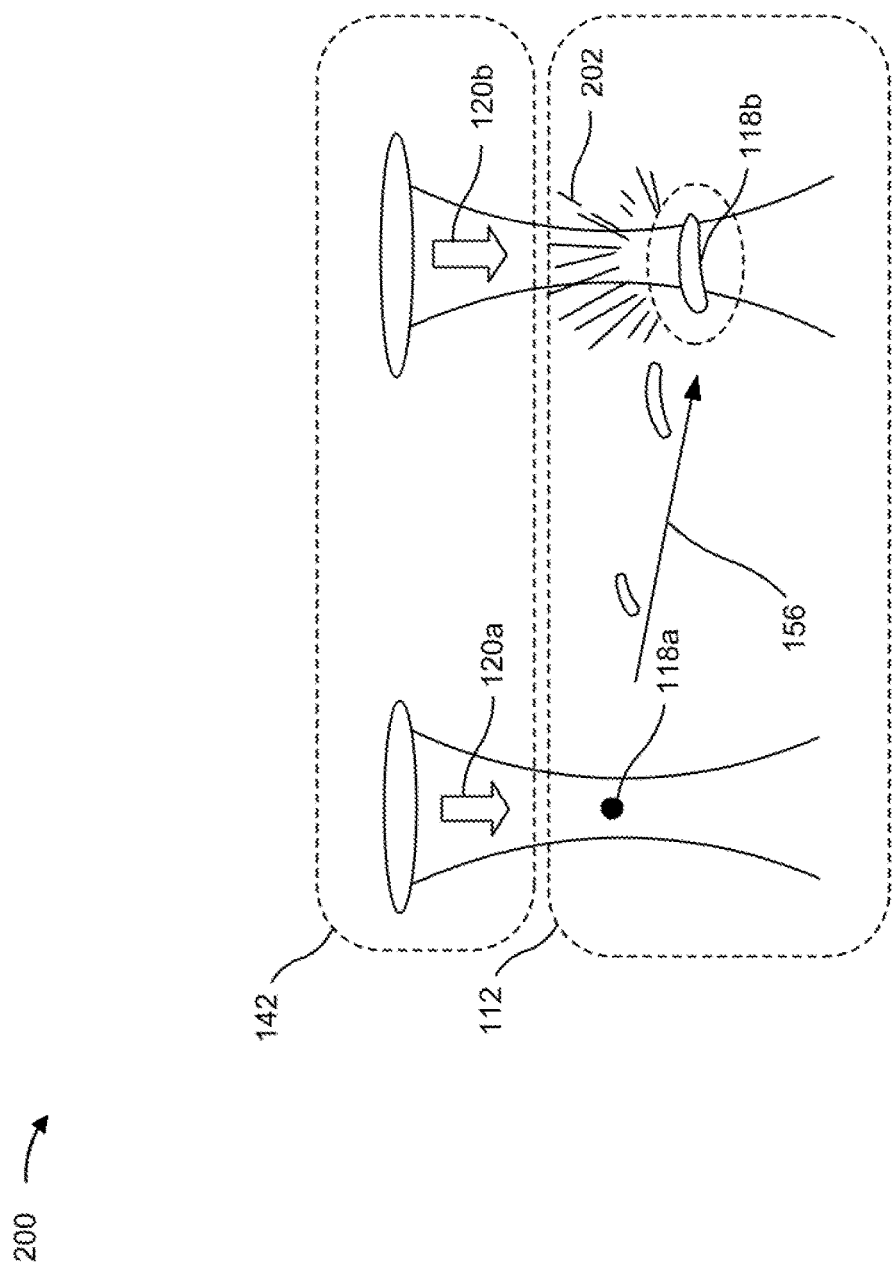
FIG. 2 is a diagram of an example implementation of a pre-pulse laser beam and a main-pulse laser beam described herein.

FIG. 2 is a diagram of an example implementation 200 of the pre-pulse laser beam 120a and a main-pulse laser beam 120b described herein. In the example implementation 200, the laser source 142 uses a multi-pulse technique (or a multi-stage pumping technique) to generate the pre-pulse laser beam 120a and the main-pulse laser beam 120b to achieve greater heating efficiency of droplets of a target material to increase conversion efficiency.

In some implementations, a droplet generator (e.g., the droplet generator 122 of FIG. 1A) provides the droplet of the target material 118a (e.g., multiples of the droplet of the target material 118a) along the path 156 at a frequency of approximately 50 kilohertz (kHz) and at a velocity of approximately 80 meters per second (m/s). Furthermore, the droplet of the target material 118a may have a diameter in a range from approximately 20 µm to approximately 30 µm. However, other values for the frequency, velocity, and diameter of the droplet of the target material 118a are within the scope of the present disclosure.

In some implementations, and as shown in FIG. 2, at a first location within the vessel 112, the pre-pulse laser beam 120a provides a first amount of energy to a droplet of the target material 118a. The energy transforms the droplet of the target material 118a into the disc-shaped droplet of the target material 118b. The disc-shaped droplet of the target material 118b may include a disc shape, a "pancake" shape, a mist, or another shape. The disc-shaped droplet of the target material 118b includes a greater surface area for excitation by the main-pulse laser beam 120b relative to the droplet of the target material 118a, which increases the conversion rate of the target material to a plasma. Within the vessel 112, the disc-shaped droplet of the target material 118b traverses the path 156 that brings the disc-shaped droplet of the target material 118b to a second location within the vessel 112. At the second location, the main-pulse laser beam 120b provides a second amount of energy to the disc-shaped droplet of the target material 118b to create a plasma 202 that generates EUV radiation as the plasma 202 dissipates.

In some implementations, timing of pulsing of laser beams from the pre-pulse laser beam 120a and the main-pulse laser beam 120b is dependent on a velocity of the disc-shaped droplet of the target material 118b, the size of the disc-shaped droplet of the target material 118b, the shape of the disc-shaped droplet of the target material 118b, the path of travel of the disc-shaped droplet of the target material 118b, and/or another parameter. As an example, the disc-shaped droplet of the target material 118b may continue traversing the path 156 at a rate of approximately 60 m/s to approximately 75 m/s, in which case timing of the pulsing of the main-pulse laser beam 120b may be offset from (e.g., lag behind) the pulse of the pre-pulse laser beam 120a by approximately 3000 microseconds. However, other values for the rate of travel of the disc-shaped droplet of the target material 118b and other values for the timing or offset between the pre-pulse laser beam 120a and the main-pulse laser beam 120b are within the scope of the present disclosure.

As indicated above, FIG. 2 is provided as an example. Other examples may differ from what is described with regard to FIG. 2.

Figure 3:
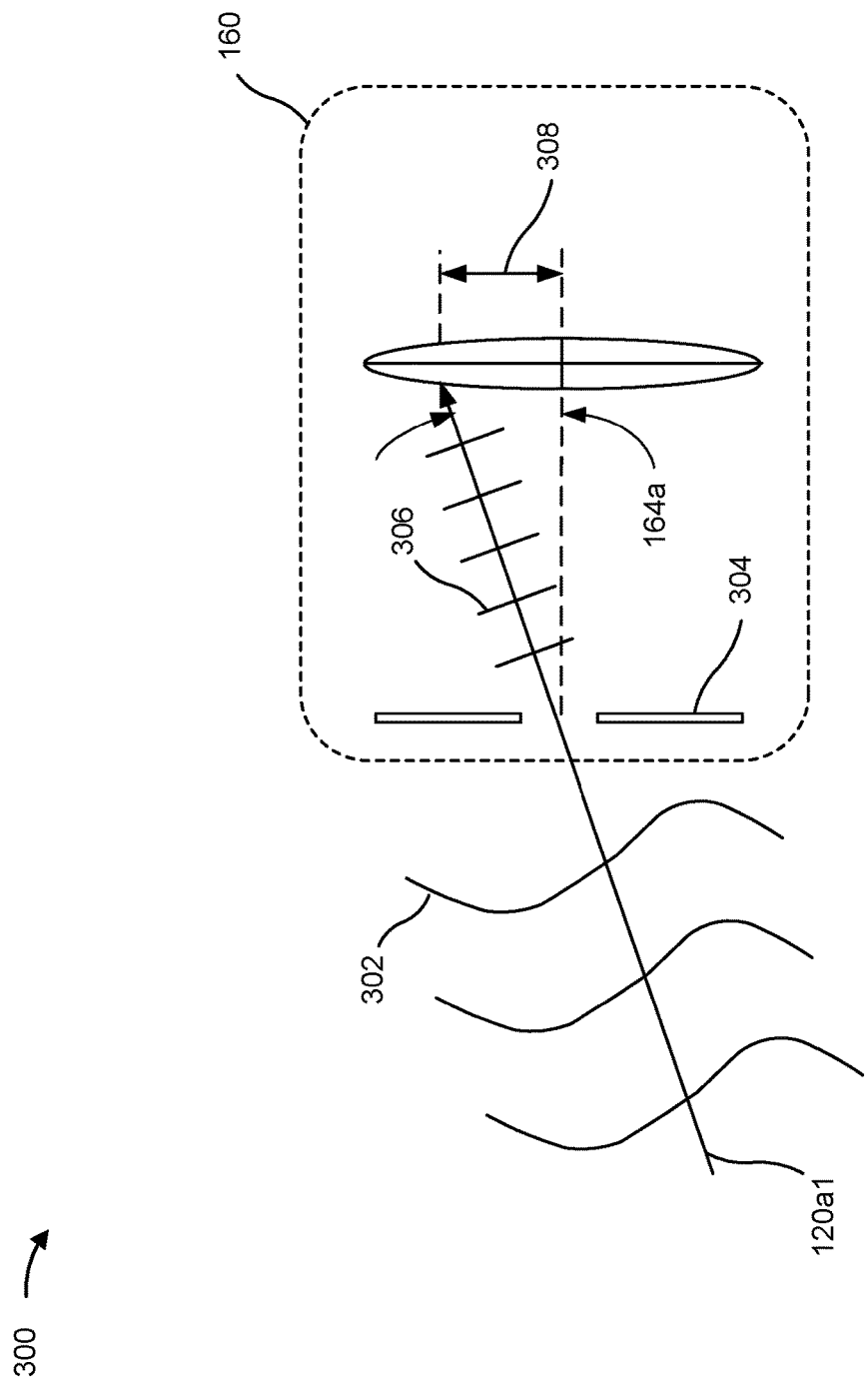
FIG. 3 is a diagram of an example implementation of a quad-cell sensor described herein.

FIG. 3 is a diagram of an example implementation 300 of the quad-cell sensor 160 described herein. FIG. 3 shows the portion 120a1 (e.g., the portion 120a1 of the pre-pulse laser beam 120a) approaching the quad-cell sensor 160 at the angle of incidence 164a. The portion 120a1 includes multiples of the wavefront 302.

In some implementations, the quad-cell sensor 160 includes an aperture 304, through which only a portion 306 of a phase of the wavefront 302 (e.g., multiples of the portion 306 of the phase of the wavefront 302) pass. The quad-cell sensor 160 may detect one or more properties of the portion 306 of the phase (e.g., an intensity, a frequency, and/or a phase angle, among other examples) and provide, to a controller, sensor data corresponding to the one or more properties. The controller may perform, based on the sensor data, Zernike computations (e.g., compute Zernike coefficients, compute Zernike modes, or compute Zernike moments, among other examples) to determine a variation in a location 308 of the portion 120a1 (e.g., corresponding to a change in the angle of incidence 164a). The variation in the location 308 may be proportional to a change in a target position of a pre-pulse laser beam (e.g., proportional to a change in the target position 154, or the angle of incidence 164d, of the pre-pulse laser beam 120a).

As indicated above, FIG. 3 is provided as an example. Other examples may differ from what is described with regard to FIG. 3.

Figure 4A:
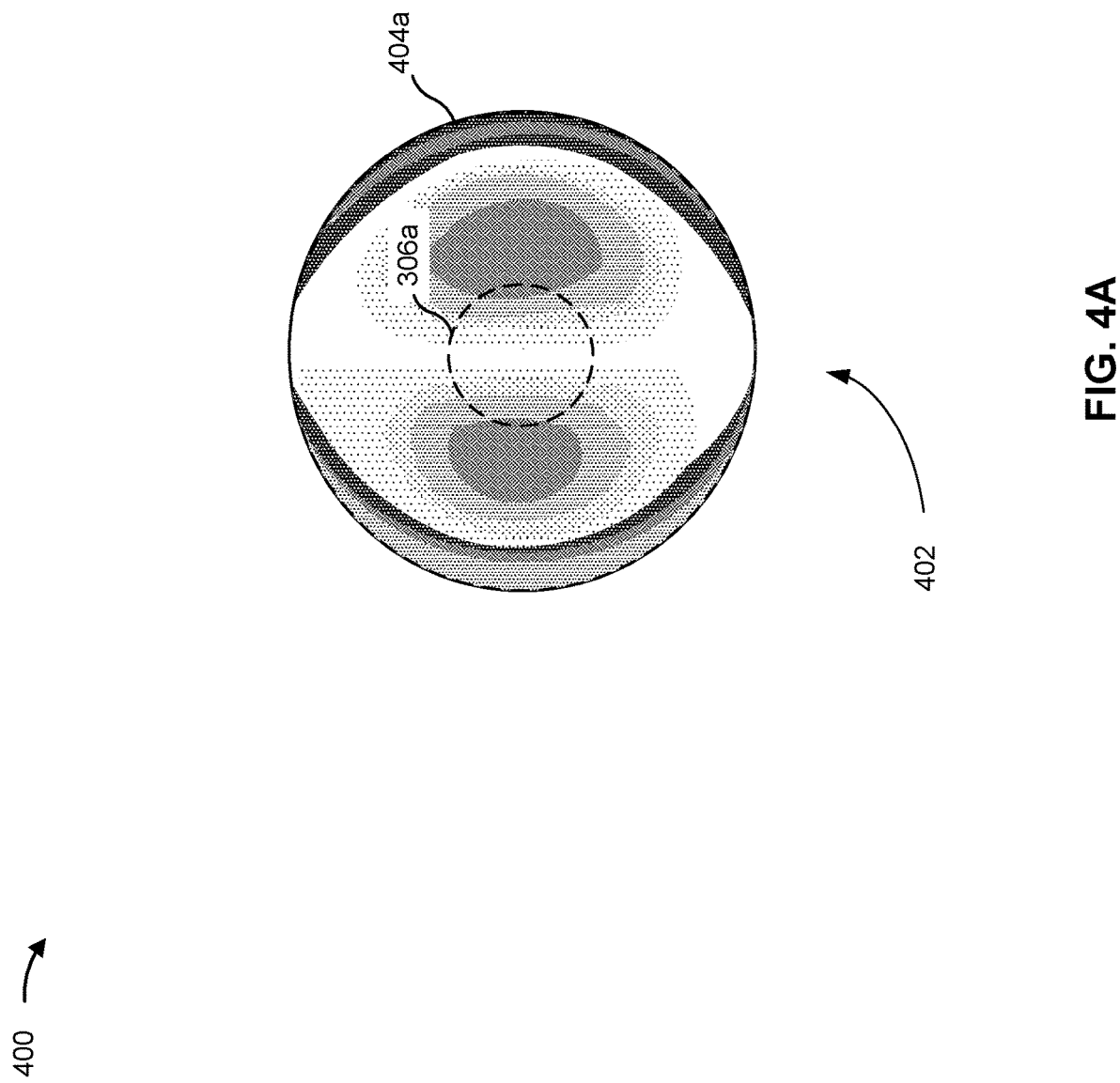
FIGS. 4A and 4B are diagrams of example implementations of phase images described herein.
Figure 4B:
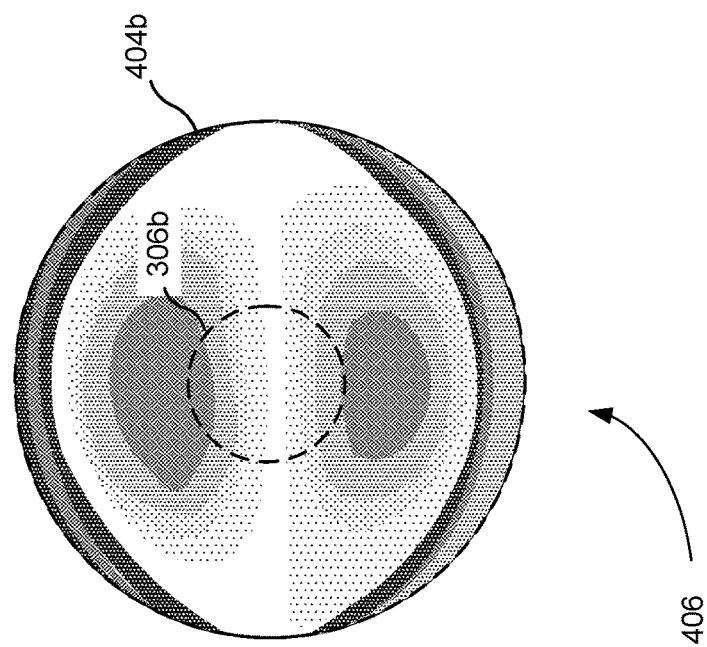

FIGS. 4A and 4B are diagrams of example implementations 400 of phase images described herein. The implementations 400 include example phase images of a wavefront (e.g., the wavefront 302) that may be computed by a controller using sensor data received from a quad-cell sensor (e.g., the quad-cell sensor 160) and a camera sensor (e.g., the camera sensor 162).

FIG. 4A shows an example phase image 402 that includes a first portion 306a of a phase of the wavefront 302 and a second portion 404a of the phase. A size of the first portion 306a of the phase, corresponding to a portion of the phase of the wavefront 302 passing through an aperture of the quad-cell sensor 160 (e.g., the aperture 304) and that is detected by the quad-cell sensor 160, is less relative to a size of the second portion 404a of the phase that is detected by the camera sensor 162. Furthermore, the first portion 306a of the phase is encompassed by the second portion 404a (e.g., the second portion 404a encompasses the first portion 306a). In other words, the first portion 306a of the phase is fully included in the second portion 404a of the phase. In other implementations, the first portion 306a and the second portion 404a are partially overlapping portions.

In some implementations, and due to the size of the first portion 306a not capturing outer regions of the phase, accuracy of the controller computing variations in a location of a portion of a pre-pulse laser beam (e.g., the variation in the location 308 of the portion 120a1 of the pre-pulse laser beam 120a) may be reduced. In such implementations, and due to the larger size of the second portion 404a relative to the size of the first portion 306a, the controller is able to compensate by computing variations in a location of another portion of the pre-pulse laser beam (e.g., the portion 120a2 of the pre-pulse laser beam 120a) using the data received from the camera sensor 162.

FIG. 4B shows an example phase image 406 that includes a first portion 306b of a phase of the wavefront 302 and a second portion 404b of the phase. A size of the first portion 306b of the phase, corresponding to a portion of the phase of the wavefront 302 passing through the aperture 304 and that is detected by the quad-cell sensor 160, is less relative to a size of the second portion 404b of the phase that is detected by the camera sensor 162. Furthermore, the first portion 306b of the phase is encompassed by the second portion 404b (e.g., the second portion 404b encompasses the first portion 306b).

In some implementations, and due to the size of the first portion 306b not capturing outer regions of the phase, accuracy of the controller computing variations in a location of a portion of a pre-pulse laser beam (e.g., the variation in the location 308 of the portion 120a1 of the pre-pulse laser beam 120a) may be reduced. In such implementations, and due to the larger size of the second portion 404b relative to the size of the first portion 306b, the controller is able to compensate by computing variations in a location of another portion of the pre-pulse laser beam (e.g., the portion 120a2 of the pre-pulse laser beam 120a) using the data received from the camera sensor 162.

As indicated above, FIGS. 4A and 4B are provided as examples. Other examples may differ from what is described with regard to FIGS. 4A and 4B.

Figure 5A:
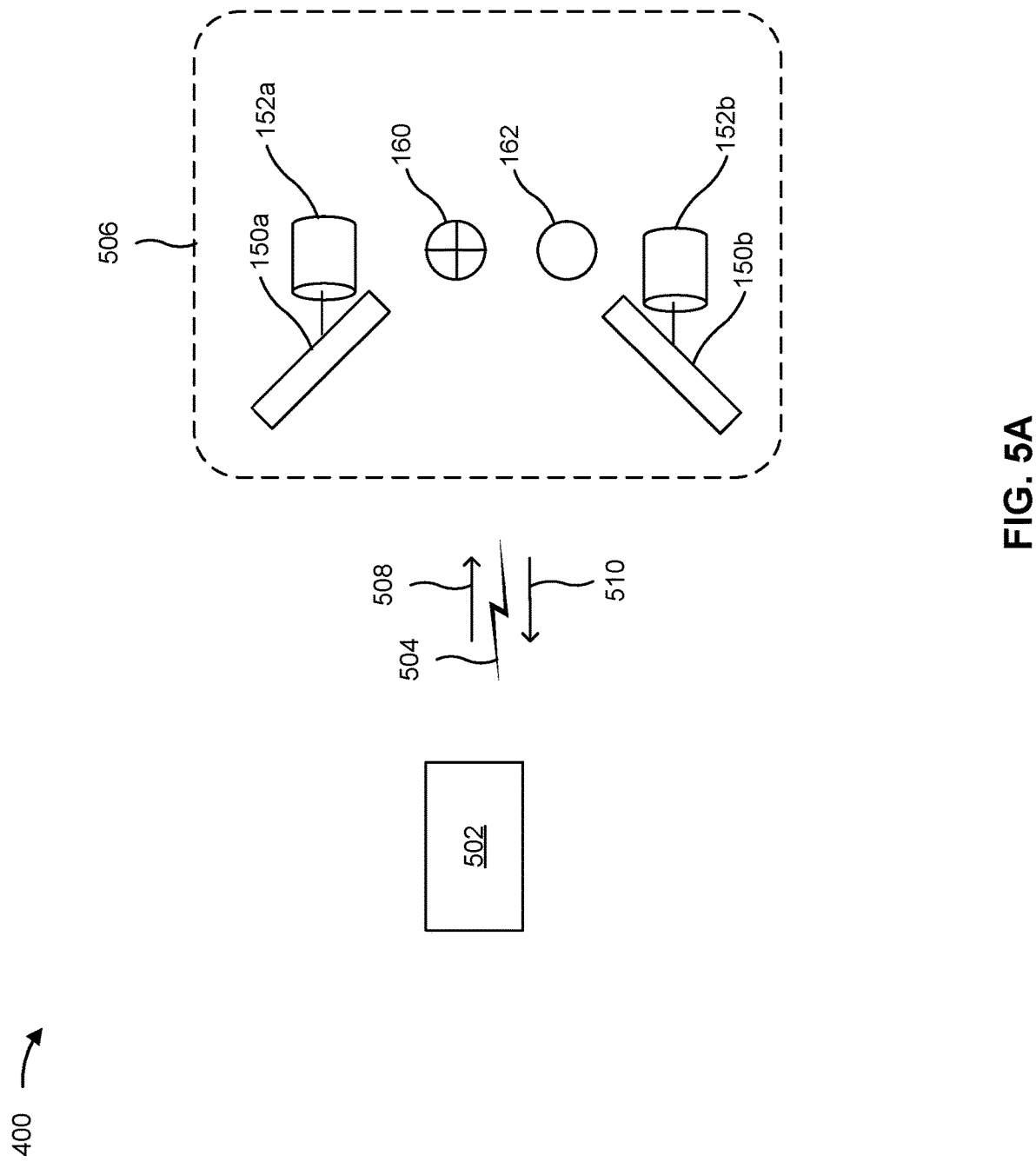
FIGS. 5A and 5B are diagrams of an example implementation of a controller that is configured to use dual-feedback from a quad-cell sensor and a camera sensor described herein.
Figure 5B:
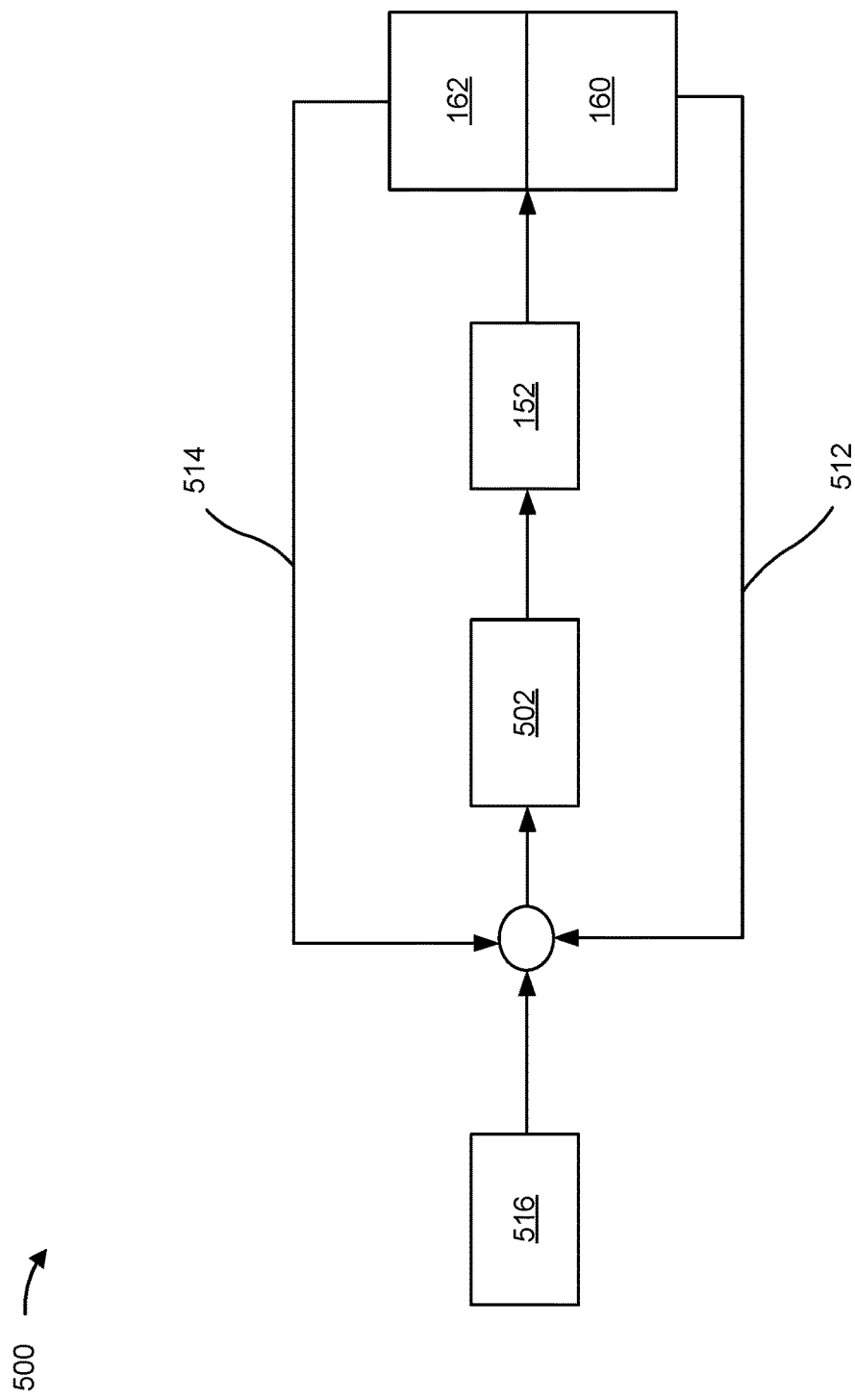

FIGS. 5A and 5B are diagrams of an example implementation 500 of a controller 502 that is configured to use dual-feedback from a quad-cell sensor and a camera sensor described herein. The controller 502 may include a processor or a combination of a processor and memory, among other examples.

FIG. 5A shows the controller 502 is communicatively connected to components of a mirror system 506 (e.g., the mirror 150a, the mirror 150b, the motor 152a, the motor 152b, the quad-cell sensor 160, or the camera sensor 162, among other examples) using one or more communication links 504 (e.g., one or more wireless-communication links, one or more wired-communication links, or a combination of one or more wireless-communication links and one or more wired-communication links, among other examples).

In some implementations, the controller 502 transmits a signal 508 to a component of the mirror system 506. For example, the controller 502 may transmit, to the motor 152a, the signal 508 to change an orientation of the mirror 150a, the signal 508 to the motor 152b to change an orientation of the mirror 150b, or the signal 508 to another component (e.g., the quad-cell sensor 160 or the camera sensor 162, among other examples) of the mirror system 506 to change a calibration setting of the component.

In some implementations, the controller 502 receives a signal 510 from a component of mirror system 506. For example, the controller 502 may receive the signal 510 from the quad-cell sensor 160, where the signal 510 includes data associated with a portion of a wavefront (e.g., the first portion 306a, among other examples). As another example, the controller 502 may receive the signal 510 from the camera sensor, where the signal 510 includes data associated with a portion of a wavefront (e.g., the second portion 404a, among other examples).

In some implementations, the controller 502 may perform processes that include receiving, from the quad-cell sensor 160, first data associated with a pre-pulse laser beam (e.g., receive, via the signal 510, data associated with the portion 120a1 of the pre-pulse laser beam 120a) provided to an EUV radiation source (e.g., the radiation source 102). Additionally, or alternatively, the controller 502 may perform processes that include receiving, from the camera sensor 162, second data associated with the pre-pulse laser beam 120a (e.g., data associated with the portion 120a2 of the pre-pulse laser beam 120a). Additionally, or alternatively, the controller 502 may perform processes that include providing, based on the first data and the second data, the signal 508 to cause an adjustment to a target position (e.g., the target position 154) of the pre-pulse laser beam 120a.

In some implementations, the controller 502 may perform processes that include receiving, from the camera sensor 162, first data associated with a pre-pulse laser beam 120a provided by a laser source (e.g., data associated with the portion 120a2 of the pre-pulse laser beam 120a) and determining, based on a comparison of the first data and second data, that a target position (e.g., the target position 154) of the pre-pulse laser beam 120a has moved over a time duration. Additionally, or alternatively, the controller 502 may perform processes that include determining, based on determining that the target position 154 of the pre-pulse laser beam 120a has moved over the time duration, to adjust a calibration setting of the mirror system 506 (e.g., a calibration setting of the motors 152, the quad-cell sensor 160, or the camera sensor 162, among other examples) controlling the target position 154 of the pre-pulse laser beam 120a. Additionally, or alternatively, the controller 502 may perform processes that include providing, based on determining to adjust the calibration setting of the mirror system 506, the signal 508 to the mirror system 506 to cause an adjustment to the calibration setting. In some implementations, the adjustment to the calibration setting is to cause the target position 154 to align to a focus region in which a droplet of a target material (e.g., the droplet of the target material 118a) is to be deformed by the pre-pulse laser beam 120a.

FIG. 5B shows additional aspects of the controller 502 in communication with the motors 152 (e.g., the motor 152a controlling an orientation of the mirror 150a and/or the motor 152b controlling an orientation of the mirror 150b). As shown in FIG. 5B, the controller 502 is configured as part of a dual-feedback system. As part of the dual-feedback system, the controller 502 may receive first data from the quad-cell sensor 160 at a first frequency using the feedback loop 512 and may receive second data from the camera sensor 162 at a second frequency using the feedback loop 514.

In some implementations, the first frequency (e.g., an operating frequency of the quad-cell sensor 160) is in a range from approximately 3 kHz to approximately 5 kHz. In some implementations, the second frequency (e.g., an operating frequency of the camera sensor 162) is in a range from approximately 22 Hz to approximately 24 Hz. Such a combination of frequencies may increase consistency and accuracy of the target position, while preserving or reducing computing resources needed by the controller 502. For example, the range of the first frequency may increase a target position adjustment rate to fine-tune target position adjustments made to intercept a stream of droplets of a target material (e.g., a stream of multiples of the droplet of the target material 118a) being provided by a droplet generator (e.g., the droplet generator 122) at a rate of 50 kilohertz. Such tuning, based on the first data that includes a reduced amount of data relative to the second data, may correspond to a rate of approximately once every ten to fifteen droplets of the target material. Additionally, and while the second data from the camera sensor 162 (e.g., an increased amount of data relative to the first data) may increase an accuracy of the target position 154 by compensating for portions of a wavefront (e.g., the wavefront 302) that the quad-cell sensor 160 may not detect, the range of the second frequency may preserve or reduce resources (e.g., computing resources) needed by the controller 502 to process the second data. However, other values and ranges for the first frequency and the second frequency are within the scope of the present disclosure.

In some implementations, the controller 502 may receive an input from another component 516 (e.g., a memory device, a processor, or a radiation sensor, among other examples). The input may include reference data (e.g., data corresponding to a reference wavefront of a reference pre-pulse laser beam determined to have been aligned to the focus region), data of a reference Zernike computation, or an amount of EUV radiation being generated by a radiation source (e.g., the radiation source 102) using the pre-pulse laser beam 120a, among other examples.

In some implementations, a system (e.g., the lithography system 100) includes the controller 502. Such a system may include a radiation source (e.g., the radiation source 102) that is configured to generate EUV light from a droplet of a target material (e.g., generate EUV light from the droplet 118 of the target material). The system may include a mirror (e.g., the mirror 150b) configured to redirect a laser beam (e.g., the pre-pulse laser beam 120a) from a laser source (e.g., the pre-pulse seed laser 144 and the pre-pulse amplifier chain 148) of the radiation source to the target position 154 corresponding to a focus region. The system may further include the quad-cell sensor 160 configured to operate at the first frequency and the camera sensor 162 configured to operate at the second frequency that is less than the first frequency. The controller 502 may be configured to receive, from the quad-cell sensor 160 at the first frequency, first data associated with the laser beam, and receive, from the camera sensor 162 at the second frequency, second data associated with the laser beam. The controller 502 may further be configured to determine, based on one or more of the first data or the second data, to adjust an orientation of the mirror 150*b* to adjust the target position 154 and provide, based on determining to adjust the orientation of the mirror 150*b* to adjust the target position 154, a signal (e.g., the signal 508) to cause an adjustment to the orientation of the mirror to adjust the target position to align to the focus region.

In connection with FIGS. 5A and 5B, and elsewhere herein, the controller 502 may adjust the target position using a machine learning model. The machine learning model may include and/or may be associated with one or more of a neural network model, a random forest model, a clustering model, or a regression model, among other examples. In some implementations, the controller 502 uses the machine learning model to adjust the target position by providing candidate calibration setting and/or motor adjustments as input to the machine learning model, and using the machine learning model to determine a likelihood, probability, or confidence that a particular outcome (e.g., an amount of an increase in EUV radiation or an increase target position accuracy, among other examples) for a subsequent exposure operation will be achieved using the candidate parameters. In some implementations, the controller 502 provides a designated amount of EUV radiation and/or a designated target position accuracy as input to the machine learning model, and the controller 502 uses the machine learning model to determine or identify a particular combination of calibration settings and/or motor adjustments that are likely to achieve the designated amount(s).

The controller 502 (or another system) may train, update, and/or refine the machine learning model to increase the accuracy of the outcomes and/or parameters determined using the machine learning model. The controller 502 may train, update, and/or refine the machine learning model based on feedback and/or results from the subsequent exposure operation, as well as from historical or related exposure operations (e.g., from hundreds, thousands, or more historical or related exposure operations) performed by an exposure tool (e.g., the exposure tool 104 of the lithography system 100, among other examples).

As an example, in some implementations the controller 502 determines a correlation relating to an increase in an amount radiation provided by a radiation source (e.g., the radiation source 102) based on a signal (e.g., the signal 508) that causes the adjustment to the target position. The controller 502 then provides information relating to the correlation to update the machine learning model to estimate the increase in the amount of radiation based on the signal 508 to cause the adjustment.

As another example, in some implementations the controller 502 determines a correlation relating to the amount of radiation provided by the radiation source including a laser source (e.g., the laser source 142 including the pre-pulse seed laser 144 and the pre-pulse amplifier chain 148) and a calibration setting of a mirror system (e.g., the mirror system 506). The controller 502 then provides information relating to the correlation to update the machine learning model to estimate the amount of EUV radiation based on the calibration setting.

As indicated above, FIGS. 5A and 5B are provided as examples. Other examples may differ from what is described with regard to FIGS. 5A and 5B. For example, another example may include additional components, fewer components, different components, or differently arranged components than those shown in FIGS. 5A and 5B. Additionally, or alternatively, a set of components (e.g., one or more components) of FIGS. 5A and 5B may perform one or more functions described herein as being performed by another set of components.

Figure 6:
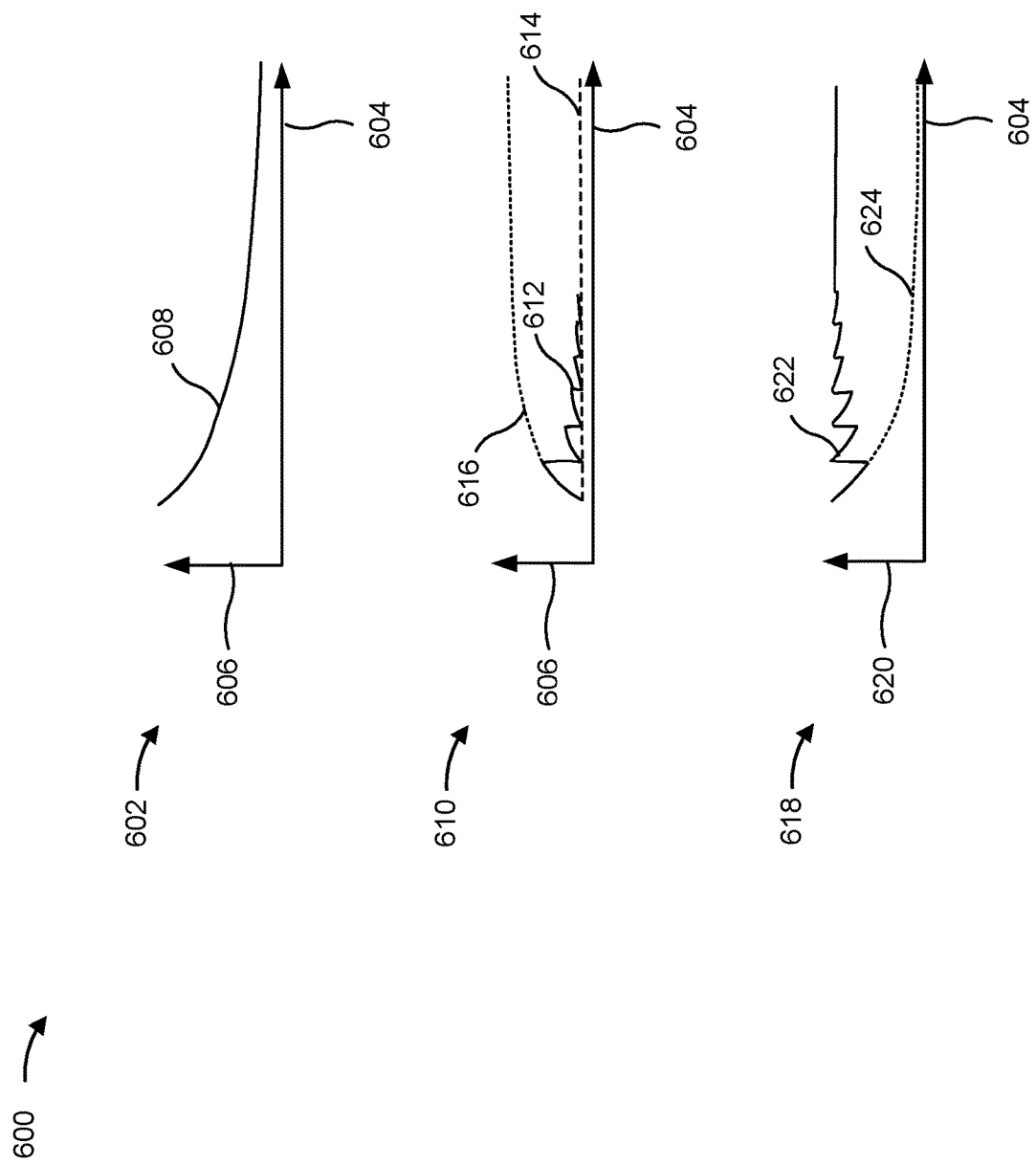
FIG. 6 is a diagram of example responses of a radiation source using a dual-feedback control system described herein.

FIG. 6 is a diagram of example responses 600 of a radiation source (e.g., the radiation source 102) using the dual-feedback control system described herein (e.g., the controller 502 receiving feedback from the quad-cell sensor 160 and the camera sensor 162).

Example response 602 shows a potential change in a target position (e.g., a "drifting" of the target position 154) of a pre-pulse laser beam (e.g., the pre-pulse laser beam 120*a*) across a period of time. Example response 602 includes a time domain 604 and position domain 606. As shown, a potential change in a target position 608 across the time domain 604 may result from thermal effects (e.g., "cold-to-hot" effects) upon a source of the pre-pulse laser beam 120*a* (e.g., thermal effects upon the pre-pulse seed laser 144 and the pre-pulse amplifier chain 148).

Example response 610 shows adjustment responses to the target position 154 made by a controller (e.g., the controller 502) based on feedback from the quad-cell sensor 160 and/or the camera sensor 162. As shown, a camera sensor adjustment response 612 and a quad-cell sensor adjustment response 614 combine to mitigate, across the time domain 604, a cumulative position error response 616 in the position domain 606.

Example response 618 shows the net effect to an amount of radiation (e.g., EUV energy) provided by the radiation source 102 based on the adjustments of the target position 154 shown by example response 610. Example response 618 includes the time domain 604 and the radiation energy domain 620. As shown in example response 618, and as a result of the adjustments in the target position 154, a maintained radiation energy response 622 is realized across the time domain 604. A degraded radiation energy response 624 is avoided across the time domain 604.

As indicated above, FIG. 6 is provided as an example. Other examples may differ from what is described with regard to FIG. 6.

Figure 7:
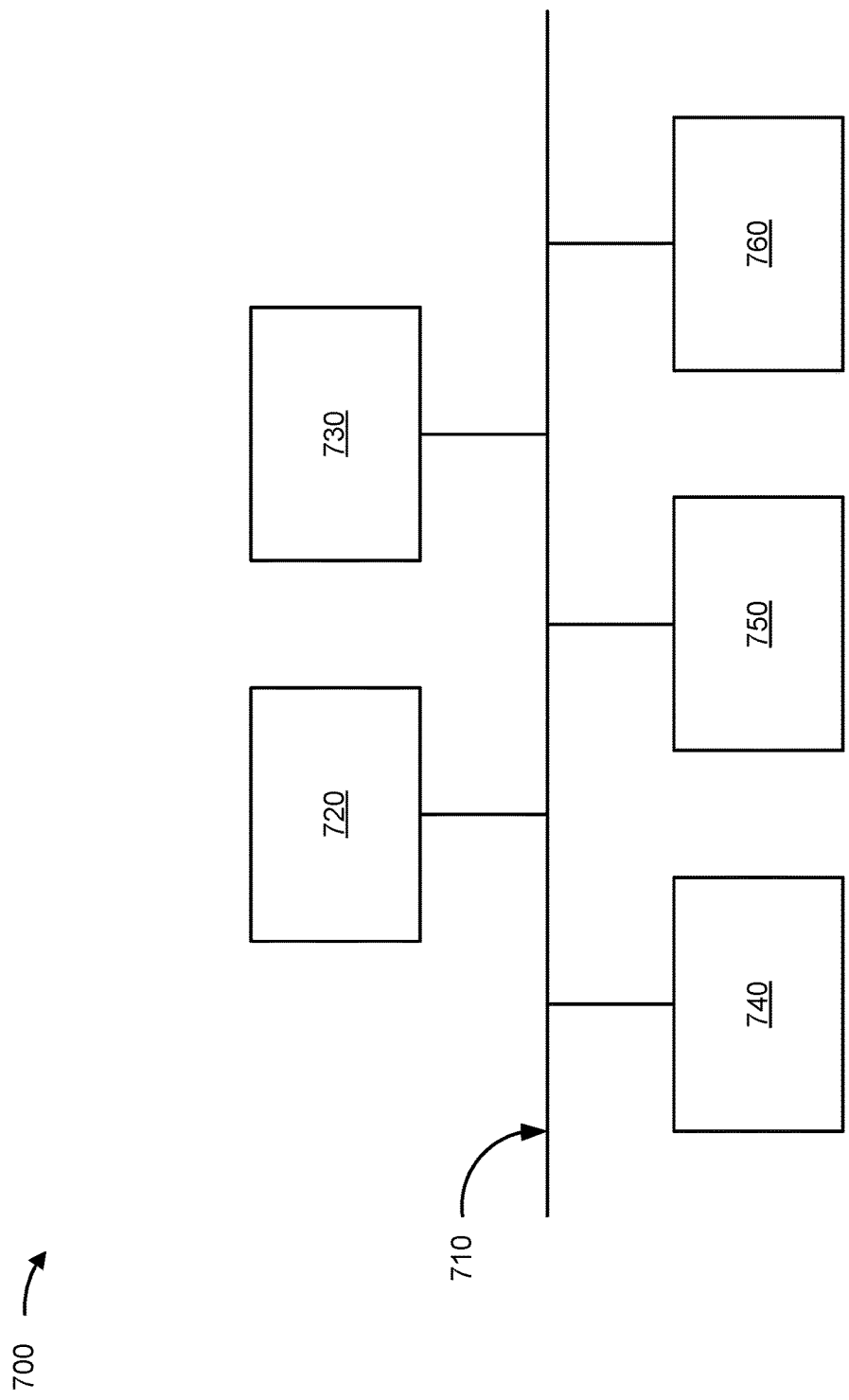
FIG. 7 is a diagram of example components of one or more devices described herein.

FIG. 7 is a diagram of example components of a device 700, which may correspond to the lithography system 100, the radiation source 102, the motors 152, the quad-cell sensor 160, the camera sensor 162, and/or the controller 502. In some implementations, the lithography system 100, the radiation source 102, the motors 152, the quad-cell sensor 160, the camera sensor 162, and/or the controller 502 include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
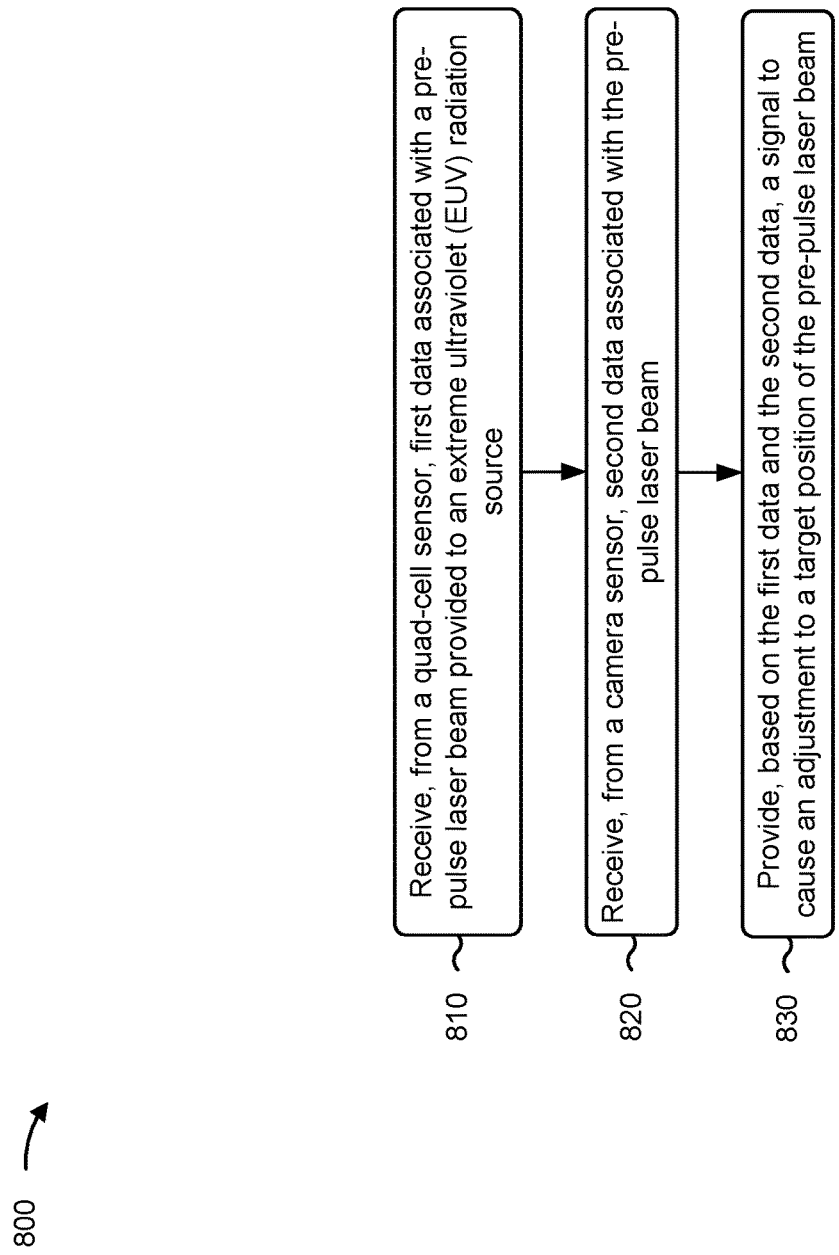
FIGS. 8-10 are flowcharts relating to adjusting a target position of a pre-pulse laser beam described herein.

FIG. 8 is a flowchart of an example process 800 relating to adjusting a target position of a pre-pulse laser beam described herein. In some implementations, one or more process blocks of FIG. 8 are performed by a lithography system including a radiation source (e.g., the lithography system 100 including the radiation source 102). In some implementations, one or more process blocks of FIG. 8 are performed by another device or a group of devices separate from or including the lithography system or the radiation source, such as one or more motors (e.g., the motors 152), a quad-cell sensor (e.g., the quad-cell sensor 160), a camera sensor (e.g., the camera sensor 162), and/or a controller (e.g., the controller 502). Additionally, or alternatively, one or more process blocks of FIG. 8 may be performed by one or more components of device 700, such as processor 720, memory 730, input component 740, output component 750, and/or communication component 760.

As shown in FIG. 8, process 800 may include receiving, from a quad-cell sensor, first data associated with a pre-pulse laser beam provided to an EUV radiation source (block 810). For example, the controller 502 may receive, from a quad-cell sensor 160, first data associated with a pre-pulse laser beam 120a provided to an EUV radiation source 102, as described above.

As further shown in FIG. 8, process 800 may include receiving, from a camera sensor, second data associated with the pre-pulse laser beam (block 820). For example, the controller 502 may receive, from the camera sensor 162, second data associated with the pre-pulse laser beam 120a, as described above.

As further shown in FIG. 8, process 800 may include providing, based on the first data and the second data, a signal to cause an adjustment to a target position of the pre-pulse laser beam (block 830). For example, the controller 502 may provide, based on the first data and the second data, a signal 708 to cause an adjustment to a target position 154 of the pre-pulse laser beam 120a, as described above.

Process 800 may include additional implementations, such as any single implementation or any combination of implementations described below and/or in connection with one or more other processes described elsewhere herein.

In a first implementation, the first data corresponds to a first portion 306a of a phase of a wavefront 302 of the pre-pulse laser beam 120a and the second data corresponds to a second portion 404a of the phase of the wavefront 302 the pre-pulse laser beam 120a.

In a second implementation, alone or in combination with the first implementation, a first size of the first portion 306a of the phase is less relative to a second size of the second portion 404a of the phase.

In a third implementation, alone or in combination with one or more of the first and second implementations, the first portion 306a of the phase is encompassed by the second portion 404a of the phase.

In a fourth implementation, alone or in combination with one or more of the first through third implementations, the signal 508 to cause the adjustment to the target position 154 of the pre-pulse laser beam 120a is to synchronize a first location of the pre-pulse laser beam 120a and a second location of a droplet of a target material 118a traversing a path 156 within a vessel 112 of the EUV radiation source 102.

In a fifth implementation, alone or in combination with one or more of the first through fourth implementations, receiving the first data includes receiving the first data at a first frequency, and receiving the second data includes receiving the second data at a second frequency that is less than the first frequency.

In a sixth implementation, alone or in combination with one or more of the first through fifth implementations, the first frequency is in a first range from approximately 3 kilohertz to approximately 5 kilohertz and the second frequency is in a second range from approximately 22 hertz to approximately 26 hertz.

In a seventh implementation, alone or in combination with one or more of the first through sixth implementations, providing the signal 508 to cause the adjustment to the target position includes providing the signal to cause the adjustment to the target position to compensate for a drift in the target position that results from a thermal effect on a laser source that generates the pre-pulse laser beam.

In an eighth implementation, alone or in combination with one or more of the first through seventh implementations, providing the signal 508 to cause the adjustment to the target position 154 includes determining, based on the first data and the second data, to adjust an orientation of at least one mirror 150b of a mirror system 506 controlling the target position 154 of the pre-pulse laser beam 120a.

In a ninth implementation, alone or in combination with one or more of the first through eight implementations, process 800 includes determining a correlation relating to an increase in an amount of EUV radiation provided by the EUV radiation source 102 based on the signal 508 to cause the adjustment, and providing information relating to the correlation to update a machine learning model that estimates the increase in the amount of EUV radiation based on the signal 508 to cause the adjustment.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Figure 9:
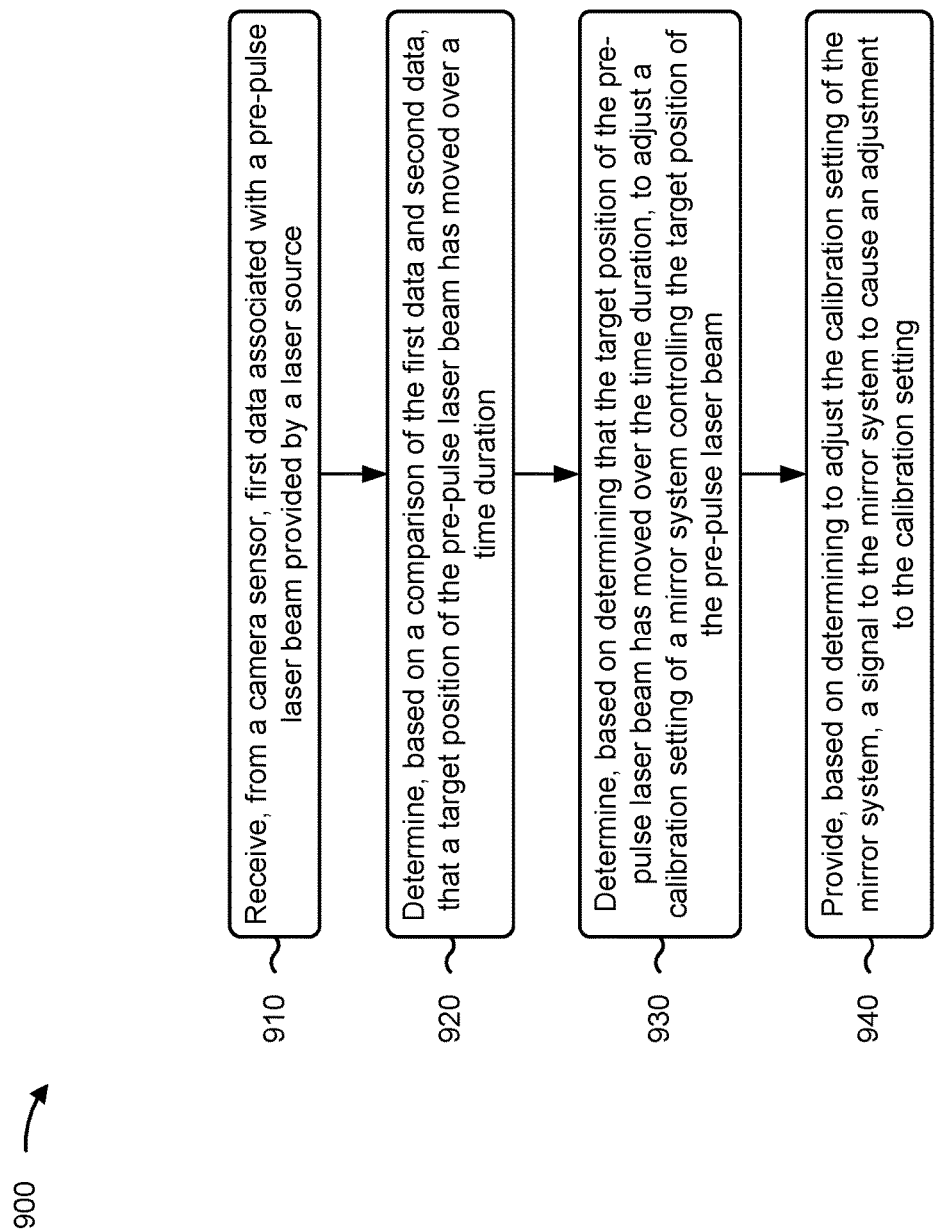

FIG. 9 is a flowchart of an example process 900 relating to adjusting a target position of a pre-pulse laser beam described herein. In some implementations, one or more process blocks of FIG. 9 are performed by a lithography system including a radiation source (e.g., the lithography system 100 including the radiation source 102). In some implementations, one or more process blocks of FIG. 9 are performed by another device or a group of devices separate from or including the lithography system or the radiation source, such as one or more motors (e.g., the motors 152), a quad-cell sensor (e.g., the quad-cell sensor 160), a camera sensor (e.g., the camera sensor 162), and/or a controller (e.g., the controller 502). Additionally, or alternatively, one or more process blocks of FIG. 9 may be performed by one or more components of device 700, such as processor 720, memory 730, input component 740, output component 750, and/or communication component 760.

As shown in FIG. 9, process 900 may include receiving, from a camera sensor, first data associated with a pre-pulse laser beam provided by a laser source (block 910). For example, the controller 502 may receive, from a camera sensor 162, may receive first data associated with a pre-pulse laser beam 120a provided by a laser source (e.g., the pre-pulse seed laser 144 and the pre-pulse amplifier chain 148), as described above.

As further shown in FIG. 9, process 900 may include determining, based on a comparison of the first data and second data, that a target position of the pre-pulse laser beam has moved over a time duration (block 920). For example, the controller 502 may determine, based on a comparison of the first data and second data, that a target position 154 of the pre-pulse laser beam 120a has moved over a time duration, as described above.

As further shown in FIG. 9, process 900 may include determining, based on determining that the target position of the pre-pulse laser beam has moved over the time duration, to adjust a calibration setting of a mirror system controlling the target position of the pre-pulse laser beam (block 930). For example, the controller 502 may determine, based on determining that the target position 154 of the pre-pulse laser beam 120a has moved over the time duration, to adjust a calibration setting of a mirror system 506 controlling the target position 154 of the pre-pulse laser beam 120a, as described above.

As further shown in FIG. 9, process 900 may include providing, based on determining to adjust the calibration setting of the mirror system, a signal to the mirror system to cause an adjustment to the calibration setting (block 940). For example, the controller 502 may provide, based on determining to adjust the calibration setting of the mirror system 506, a signal 508 to the mirror system 506 to cause an adjustment to the calibration setting. In some implementations, the adjustment to the calibration setting is to cause the target position 154 to align to a focus region in which a droplet of a target material 118a is to be deformed by the pre-pulse laser beam 120a, as described above.

Process 900 may include additional implementations, such as any single implementation or any combination of implementations described below and/or in connection with one or more other processes described elsewhere herein.

In a first implementation, the first data includes data corresponding to a wavefront 302 of the pre-pulse laser beam 120a.

In a second implementation, alone or in combination with the first implementation, the second data includes reference data corresponding to a reference wavefront of a reference pre-pulse laser beam determined to have been aligned to the focus region.

In a third implementation, alone or in combination with one or more of the first and second implementations, process 900 includes determining a correlation relating to an amount of EUV radiation provided by an EUV radiation source 102 including the laser source (e.g., the pre-pulse seed laser 144 and the pre-pulse amplifier chain 148) and the calibration setting, and providing information relating to the correlation to update a machine learning model that estimates the amount of EUV radiation based on the calibration setting.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

Figure 10:
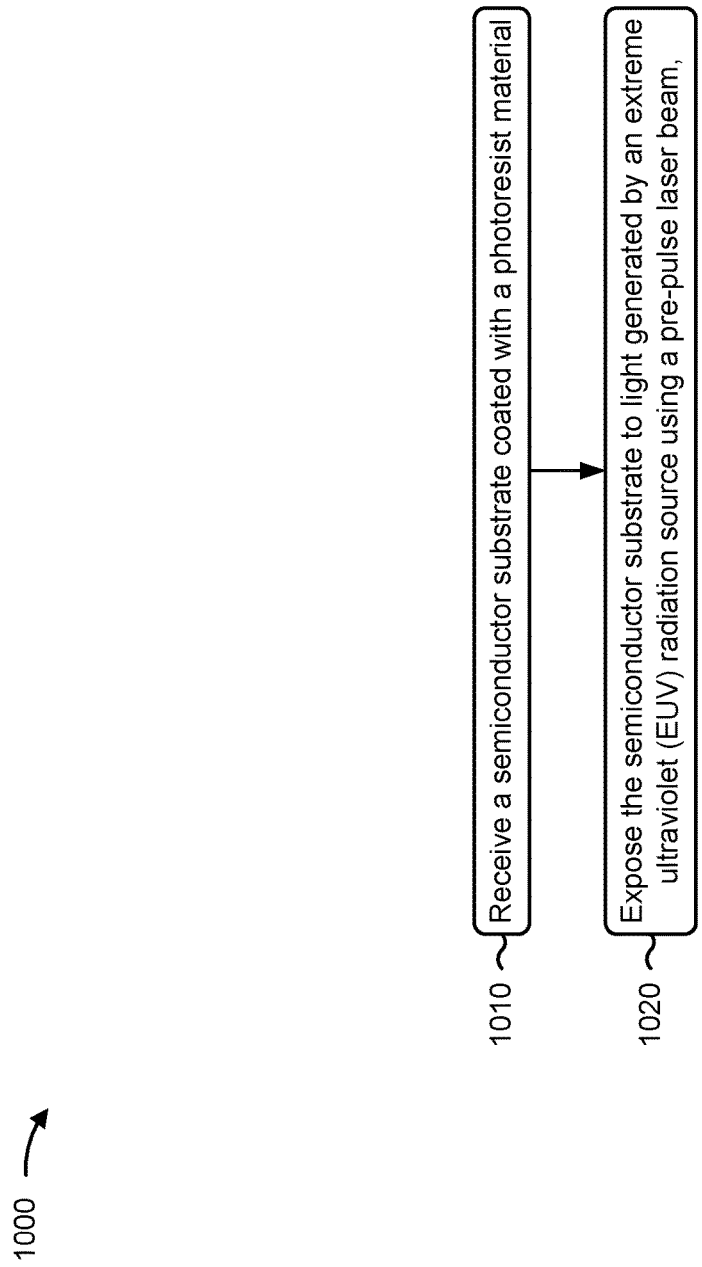

FIG. 10 is a flowchart of an example process 1000 relating to adjusting a target position of a pre-pulse laser beam described herein. In some implementations, one or more process blocks of FIG. 8 are performed by a lithography system including a radiation source (e.g., the lithography system 100 including the radiation source 102). In some implementations, one or more process blocks of FIG. 10 are performed by another device or a group of devices separate from or including the lithography system or the radiation source, such as one or more motors (e.g., the motors 152), a quad-cell sensor (e.g., the quad-cell sensor 160), a camera sensor (e.g., the camera sensor 162), and/or a controller (e.g., the controller 502). Additionally, or alternatively, one or more process blocks of FIG. 10 may be performed by one or more components of device 700, such as processor 720, memory 730, input component 740, output component 750, and/or communication component 760.

As shown in FIG. 10, process 1000 may include receiving a semiconductor substrate coated with a photoresist material (block 1010). For example, the lithography system 100 may receive a semiconductor substrate 110 coated with a photoresist material, as described above.

As further shown in FIG. 10, process 1000 may include exposing the semiconductor substrate to light generated by an EUV radiation source using a pre-pulse laser beam, as described above (block 1020). For example, the lithography system 100 may expose the semiconductor substrate 110 to light generated by the EUV radiation source (e.g., the radiation source 102) using a pre-pulse laser beam 120a, as described above. In some implementations, using the pre-pulse laser beam 120a includes receiving, by a controller 502 from a quad-cell sensor 160, first data associated with the pre-pulse laser beam 120a and receiving, by the controller 502 from a camera sensor 162, second data associated with the pre-pulse laser beam 120a. Additionally, or alternatively, using the pre-pulse laser beam 120a includes providing, by the controller 502 based on the first data and the second data, a signal 708 to cause an adjustment to a target position 154 of the pre-pulse laser beam 120a, as described above.

Process 1000 may include additional implementations, such as any single implementation or any combination of implementations described below and/or in connection with one or more other processes described elsewhere herein.

In a first implementation, the first data corresponds to a first portion 306a of a phase of a wavefront 302 of the pre-pulse laser beam 120a and the second data corresponds to a second portion 404a of the phase of the wavefront 302 the pre-pulse laser beam 120a.

In a second implementation, alone or in combination with the first implementation, a first size of the first portion 306a of the phase is less relative to a second size of the second portion 404a of the phase.

In a third implementation, alone or in combination with one or more of the first and second implementations, the first portion 306a of the phase is encompassed by the second portion 404a of the phase.

In a fourth implementation, alone or in combination with one or more of the first through third implementations, the signal 508 to cause the adjustment to the target position 154 of the pre-pulse laser beam 120a is to synchronize a first location of the pre-pulse laser beam 120a and a second location of a droplet of a target material 118a traversing a path 156 within a vessel 112 of the EUV radiation source 102.

In a fifth implementation, alone or in combination with one or more of the first through fourth implementations, receiving the first data includes receiving the first data at a first frequency, and receiving the second data includes receiving the second data at a second frequency that is less than the first frequency.

In a sixth implementation, alone or in combination with one or more of the first through fifth implementations, the first frequency is in a first range from approximately 3 kilohertz to approximately 5 kilohertz and the second frequency is in a second range from approximately 22 hertz to approximately 26 hertz.

In a seventh implementation, alone or in combination with one or more of the first through sixth implementations, providing the signal 508 to cause the adjustment to the target position includes providing the signal to cause the adjustment to the target position to compensate for a drift in the target position that results from a thermal effect on a laser source that generates the pre-pulse laser beam.

In an eighth implementation, alone or in combination with one or more of the first through seventh implementations, providing the signal 508 to cause the adjustment to the target position 154 includes determining, based on the first data and the second data, to adjust an orientation of at least one mirror 150b of a mirror system 506 controlling the target position 154 of the pre-pulse laser beam 120a.

In a ninth implementation, alone or in combination with one or more of the first through eight implementations, process 1000 includes determining a correlation relating to an increase in an amount of EUV radiation provided by the EUV radiation source 102 based on the signal 508 to cause the adjustment, and providing information relating to the correlation to update a machine learning model that estimates the increase in the amount of EUV radiation based on the signal 508 to cause the adjustment.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Techniques described herein provide an EUV radiation source using a dual-feedback control system to control and adjust a target position of a pre-pulse laser beam. In addition to using feedback from a high-frequency quad-cell sensor to adjust a target position of the pre-pulse laser beam based on a first portion of a phase of a wavefront of the pre-pulse laser beam, the dual-feedback control system uses feedback from a low-frequency camera sensor to adjust the target position of the pre-pulse laser beam based on a second portion of the phase of the wavefront. In this way, the EUV radiation source maintains an accurate target position of the pre-pulse laser beam to maintain a designated EUV radiation dose, a targeted yield rate or quality of semiconductor devices manufactured using the EUV radiation source, and/or an efficient use of the target material, among other examples.

As described in greater detail above, some implementations described herein provide a method. The method includes receiving, by a lithography system, a semiconductor substrate coated with a photoresist material. The method includes exposing, by the lithography system, the semiconductor substrate to light generated by an EUV radiation source using a pre-pulse laser beam. In some implementations, using the pre-pulse laser beam includes receiving, by a controller from a quad-cell sensor, first data associated with the pre-pulse laser beam and receiving, by the controller from a camera sensor, second data associated with the pre-pulse laser beam. In some implementations, the method includes providing, by the controller based on the first data and the second data, a signal to cause an adjustment to a target position of the pre-pulse laser beam.

As described in greater detail above, some implementations described herein provide a method. The method includes receiving, by a controller from a camera sensor, first data associated with a pre-pulse laser beam provided by a laser source. The method includes determining, by the controller based on a comparison of the first data and second data, that a target position of the pre-pulse laser beam has moved over a time duration. The method includes determining, by the controller based on determining that the target position of the pre-pulse laser beam has moved over the time duration, to adjust a calibration setting of a mirror system controlling the target position of the pre-pulse laser beam. The method includes providing, by the controller based on determining to adjust the calibration setting of the mirror system, a signal to the mirror system to cause an adjustment to the calibration setting, where the adjustment to the calibration setting is to cause the target position to align to a focus region in which a droplet of a target material is to be deformed by the pre-pulse laser beam.

As described in greater detail above, some implementations described herein provide a system. The system includes a radiation source configured to generate EUV light from a droplet of a target material. The system includes a mirror configured to redirect a laser beam from a laser source of the radiation source to a target position corresponding to a focus region. The system includes a quad-cell sensor configured to operate at a first frequency. The system includes a camera sensor configured to operate at a second frequency that is less than the first frequency. The system includes a controller configured to receive, from the quad-cell sensor at the first frequency, first data associated with the laser beam. The controller is configured to receive, from the camera sensor at the second frequency, second data associated with the laser beam. The controller is configured to determine, based on one or more of the first data or the second data, to adjust an orientation of the mirror to adjust the target position. The controller is configured to provide, based on determining to adjust the orientation of the mirror to adjust the target position, a signal to cause an adjustment to the orientation of the mirror to adjust the target position to align to the focus region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving, by a lithography system, a semiconductor substrate coated with a photoresist material; and
   exposing, by the lithography system, the semiconductor substrate to light generated by an extreme ultraviolet (EUV) radiation source using a pre-pulse laser beam, wherein using the pre-pulse laser beam comprises:
      receiving, by a controller from a quad-cell sensor, first data associated with the pre-pulse laser beam, wherein the first data corresponds to a first portion of a phase of a wavefront of a first portion of the pre-pulse laser beam;
      receiving, by the controller from a camera sensor, second data associated with the pre-pulse laser beam, wherein the second data corresponds to a second portion of the phase of the wavefront of a second portion the pre-pulse laser beam; and
      providing, by the controller based on the first data and the second data, a signal to cause an adjustment to a target position of the pre-pulse laser beam.

2. The method of claim 1, wherein a first size of the first portion of the phase is less relative to a second size of the second portion of the phase.

3. The method of claim 1, wherein the first portion of the phase is encompassed by the second portion of the phase.

4. The method of claim 1, wherein the signal to cause the adjustment to the target position of the pre-pulse laser beam is to synchronize a first location of the pre-pulse laser beam and a second location of a droplet of a target material traversing a path within a vessel of the EUV radiation source.

5. The method of claim 1, wherein receiving the first data comprises:
   receiving the first data at a first frequency; and
   wherein receiving the second data comprises:
      receiving the second data at a second frequency that is less than the first frequency.

6. The method of claim 5, wherein the first frequency is in a first range from approximately 3 kilohertz to approximately 5 kilohertz and the second frequency is in a second range from approximately 22 hertz to approximately 26 hertz.

7. The method of claim 1, wherein providing the signal to cause the adjustment to the target position comprises:
   providing the signal to cause the adjustment to the target position to compensate for a drift in the target position that results from a thermal effect on a laser source that generates the pre-pulse laser beam.

8. The method of claim 1, wherein providing the signal to cause the adjustment to the target position comprises:
   determining, based on the first data and the second data, to adjust an orientation of at least one mirror of a mirror system controlling the target position of the pre-pulse laser beam.

9. The method of claim 1, further comprising:
   determining a correlation relating to an increase in an amount of EUV radiation provided by the EUV radiation source based on the signal to cause the adjustment; and
   providing information relating to the correlation to update a machine learning model that estimates the increase in the amount of EUV radiation based on the signal to cause the adjustment.

10. A method, comprising:
    receiving, by a controller from a camera sensor, first data associated with a pre-pulse laser beam provided by a laser source;
    determining, by the controller based on a comparison of the first data and second data, that a target position of the pre-pulse laser beam has moved over a time duration, wherein the first data corresponds to a first portion of a phase of a wavefront of a first portion of the pre-pulse laser beam and the second data corresponds to a second portion of the phase of the wavefront of a second portion the pre-pulse laser beam;
    determining, by the controller based on determining that the target position of the pre-pulse laser beam has moved over the time duration, to adjust a calibration setting of a mirror system controlling the target position of the pre-pulse laser beam; and
    providing, by the controller based on determining to adjust the calibration setting of the mirror system, a signal to the mirror system to cause an adjustment to the calibration setting,
    wherein the adjustment to the calibration setting is to cause the target position to align to a focus region in which a droplet of a target material is to be deformed by the pre-pulse laser beam.

11. The method of claim 10, further comprising:
    determining a correlation relating to an amount of EUV radiation provided by an EUV radiation source including the laser source and the calibration setting; and
    providing information relating to the correlation to update a machine learning model that estimates the amount of EUV radiation based on the calibration setting.

12. The method of claim 10, wherein receiving the first data comprises:
    receiving the first data at a first frequency; and
    the method further comprising:
       receiving the second data at a second frequency different from the first frequency.

13. The method of claim 12, wherein the second frequency is less than the first frequency.

14. A system, comprising:
a radiation source configured to generate extreme ultraviolet (EUV) light from a droplet of a target material;
a mirror configured to redirect a laser beam from a laser source of the radiation source to a target position corresponding to a focus region;
a quad-cell sensor configured to operate at a first frequency;
a camera sensor configured to operate at a second frequency that is less than the first frequency; and
a controller configured to:
receive, from the quad-cell sensor at the first frequency, first data associated with the laser beam, wherein the first data corresponds to a first portion of a phase of a wavefront of the laser beam;
receive, from the camera sensor at the second frequency, second data associated with the laser beam, wherein the second data corresponds to a second portion of the phase that encompasses the first portion of the phase;
determine, based on one or more of the first data or the second data, to adjust an orientation of the mirror to adjust the target position; and
provide, based on determining to adjust the orientation of the mirror to adjust the target position, a signal to cause an adjustment to the orientation of the mirror to adjust the target position to align to the focus region.

15. The system of claim 14, wherein the focus region corresponds to a pre-pulse laser focus region and the laser beam corresponds to a pre-pulse laser beam to deform the droplet of the target material.

16. The system of claim 14, wherein the focus region corresponds to a main-pulse laser focus region and the laser beam corresponds to a main-pulse laser beam to generate a plasma from the droplet of the target material.

17. The system of claim 14, wherein an optical component redirects a portion of the laser beam to the quad-cell sensor to generate the first data.

18. The system of claim 14, wherein an optical component redirects a portion of the laser beam to the camera sensor to generate the second data.

19. The system of claim 14, wherein the signal to cause the adjustment to the target position is to synchronize a first location of the laser beam and a second location of a droplet of a target material traversing a path within a vessel of the radiation source.

20. The system of claim 14, wherein the controller is further configured to:
determine a correlation relating to an increase in an amount of EUV radiation provided by the radiation source based on the signal to cause the adjustment; and
provide information relating to the correlation to update a machine learning model that estimates the increase in the amount of EUV radiation based on the signal to cause the adjustment.

* * * * *